United States Patent [19]

Hester

[11] Patent Number: 4,460,873
[45] Date of Patent: Jul. 17, 1984

[54] ACTIVE DIFFERENTIAL OUTPUT DIRECT CURRENT OFFSET VOLTAGE COMPENSATION CIRCUIT FOR A DIFFERENTIAL AMPLIFIER

[75] Inventor: Richard E. Hester, Eden Prairie, Minn.

[73] Assignee: Control Data Corporation, Minneapolis, Minn.

[21] Appl. No.: 442,946

[22] Filed: Nov. 19, 1982

[51] Int. Cl.³ .............................................. H03F 3/45
[52] U.S. Cl. .................................... 330/259; 330/261; 330/311
[58] Field of Search ............... 330/257, 259, 260, 261, 330/311

[56] References Cited

U.S. PATENT DOCUMENTS

| | | | |
|---|---|---|---|
| 3,444,476 | 5/1969 | Leidich | 330/69 |
| 3,721,914 | 3/1973 | Nakamura | 330/259 |
| 3,731,215 | 5/1973 | Peil et al. | 330/254 |
| 3,940,708 | 2/1976 | Sumi et al. | 330/254 |
| 4,024,462 | 5/1977 | Highnote et al. | 330/259 |
| 4,156,854 | 5/1979 | Weller | 330/259 |

OTHER PUBLICATIONS

Schwarz, T. A., "Offset Compensation Circuit", Feb. 1977, IBM Technical Diclosure Bulletin, vol. 19, No. 9, pp. 3584–3585.
Erdi, George, "A Precision Trim Technique for Monolithic Analog Circuits", Dec. 1975, IEEE Journal of Solid-State Circuits, vol. SC-10, No. 6, pp. 412–416.

Primary Examiner—James B. Mullins
Attorney, Agent, or Firm—W. J. McGinnis; J. A. Genovese

[57] ABSTRACT

The voltage output of a differential amplifier is adjusted using an active feedback loop so that there is no direct current potential difference between the differential outputs of the differential amplifier. A potential difference at the differential output of a differential amplifier due to inherent bias or operating characteristics of the system is referred to as direct current offset voltage and the need to correct this condition may be referred to as differential output direct current offset voltage compensation. The feedback loop to accomplish this compensation consists of one or more stages of isolation and amplification driven by the output voltages of the differential amplifier and having a high input impedance to diminish loading of the amplifier outputs. A voltage peak detection system is used in order to isolate direct current voltage values from alternating current voltage values appearing at the differential amplifier output. This direct current peak detected value controls a current source which sums its output current to the current output of the differential amplifier to drive any direct current differential output to a minimum or zero value.

8 Claims, 1 Drawing Figure

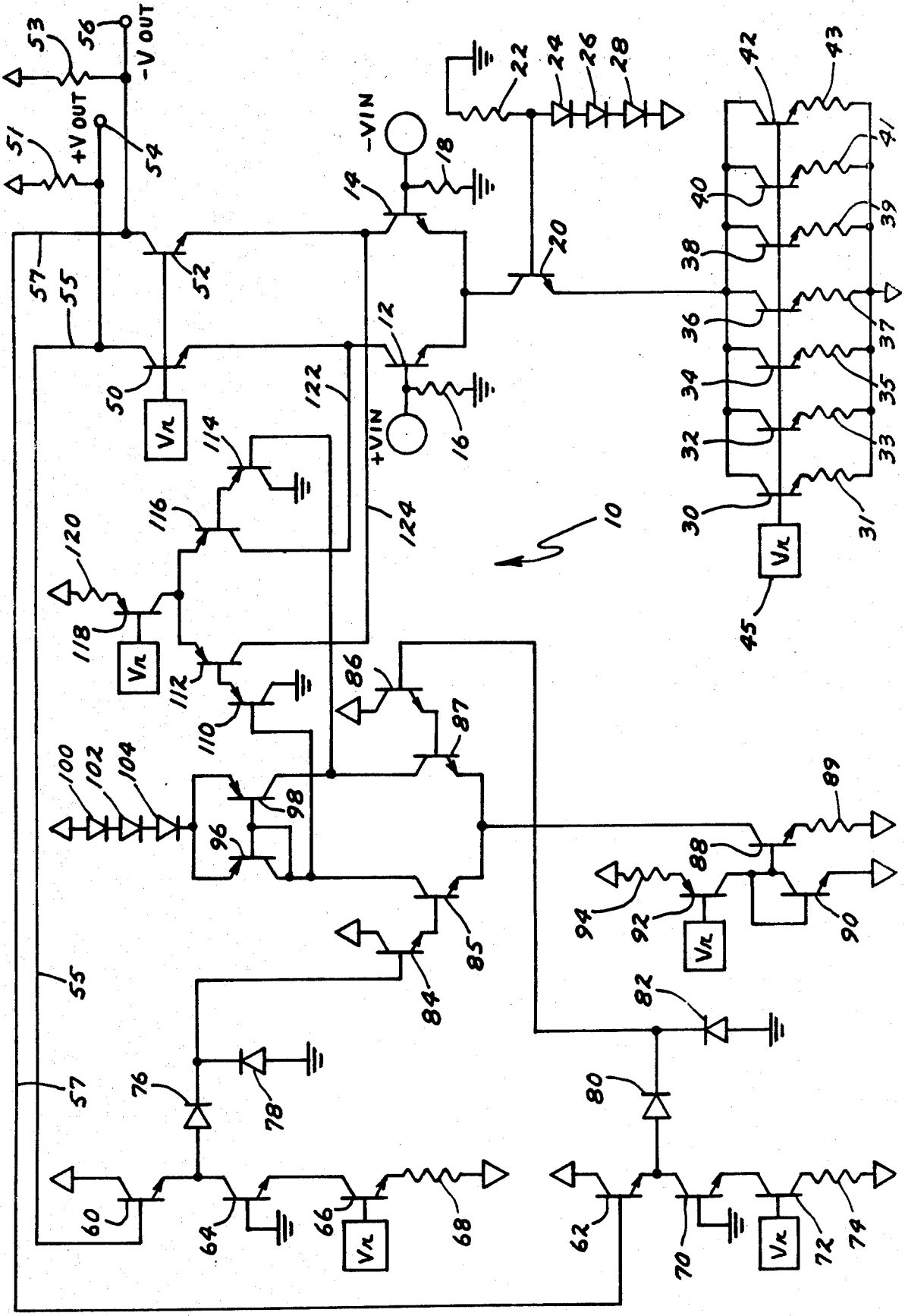

ACTIVE DIFFERENTIAL OUTPUT DIRECT CURRENT OFFSET VOLTAGE COMPENSATION CIRCUIT FOR A DIFFERENTIAL AMPLIFIER

BACKGROUND OF THE INVENTION

The present invention relates to differential amplifier circuits. In particular, the invention relates to a feedback loop to be used with a low noise differential amplifier circuit to correct any tendency to have a direct current offset voltage inherent in the differential amplifier differential output. Thus, the present invention relates to a differential amplifier circuit which has an active direct current differential output offset voltage compensation circuit. In particular, the embodiment of the invention shown in this application is adapted for use as an integrated circuit differential amplifier having active output offset voltage compensation.

If a differential amplifier circuit is built in a laboratory or test environment using discrete components, various parameters of the circuit may be readily adjusted by adjustment of the values of the discrete components. However, when differential amplifier circuits are manufactured as integrated circuit devices and where a volume output is desired for manufacturing purposes, individual adjustment or alteration of particular circuits is not desirable and in some cases is not completely feasible. In an article entitled "A Precision Trim Technique for Monolithic Analog Circuits", George Erdi, IEEE Journal of Solid State Circuits, Vol. SC-10, No. 6, December 1975, pgs. 412–416, a technique is shown where adjustment of integrated circuit amplifiers can be accomplished by permanently destroying Zener diode devices fabricated into the original integrated circuit chip. However, this technique is based on the assumption that the device will have a permanent unchanging load and that the values within the circuit will not change to create altered conditions during its life time. There is a need to have a differential amplifier which is compensated and which may be used with multiple input channels where the input may be switched from one channel to another.

One technique for forcing the differential output of a differential amplifier to have a zero direct current differential value is shown in *IBM Technical Disclosure Bulletin* "Offset Compensation Circuit", Vol. 19, No. 9, February 1977, pgs. 3,584–3,585. This circuit shows an isolation and peak detector arrangement for driving a high impedance comparator and current switch which is used to compensate the output of the differential amplifier. This circuit works as a result of the comparator and current switch adding additional current to the collector resistor circuit of the cascode amplifier stage thereby increasing the voltage drop in that resistor. In environments requiring an extremely low noise differential amplifier, the addition of collector current through a collector resistor will in fact add to the noise level generated by the circuit. Some applications are so critical that achieving differential output offset voltage compensation by means of a current adding circuit which also increases the noise would produce an unacceptable combination. Thus, there is a need for a low noise differential direct current output offset voltage compensation circuit.

A number of patents are known to applicant dealing with differential amplifiers and error correction or feedback systems. However, these patents are not related to the use of feedback for reducing to zero a differential direct current offset voltage at the differential outputs of such an amplifier. For example, U.S. Pat. No. 3,444,476 deals with a differential amplifier having feedback to control the direct current operating point and reduce variations in output which might be caused by power supply fluctuations. Similarly, U.S. Pat. No. 3,721,914 shows the use of a direct current feedback loop in a two stage differential amplifier in order to control the direct current operating point of the amplifier.

U.S. Pat. No. 3,731,215 shows a multi-stage amplifier with a direct current differential feedback network 25–30 in FIG. 1 which is connected as a negative differential feedback to the input of the amplifier circuit for the purpose of stabilizing the amplifier and to minimize the offset voltage at the output. However, this circuit does not work in the manner of the present invention by directly controlling current in the final amplifier to provide differential direct current output compensation.

U.S. Pat. No. 4,024,462 shows a differential amplifier having a low direct offset current value as a result of using precisely selected emitter current control resistors in high gain Darlington amplifier circuits which are controlled by different amplifiers to maintain the collector currents of the Darlington amplifiers substantially equal to the controlled emitter currents. The present application does not depend on the type of feedback shown in the patent nor on the selection of precisely matched resistive components for its function.

U.S. Pat. No. 3,940,708 shows a two stage differential amplifier gain control circuit in which variable current sources must be provided to vary the current flowing in a load of one of the differential amplifier circuits and to thereby vary the load impedance and maintain the direct current offset at the output of the circuit at a constant value. However, this circuit does not anticipate the feedback circuit of the present invention.

SUMMARY OF THE INVENTION

The present invention is a differential amplifier having a feedback circuit to minimize or reduce to zero any direct current differential offset voltage at the output. The present invention is particularly adapted to be a low noise circuit which may be embodied in an integrated circuit device in which multiple input channels may be switchably connected as the input. The low noise feature is particularly important in that currents flowing at particular points in the circuit and resistances in the circuit are optimally designed for the lowest possible noise generated internally in the circuit.

The primary differential amplifier of the present invention is shown with an embodiment which has conventional inputs to a pair of NPN transistors with a current controlled emitter power supply to regulate the emitter current. The output of the amplifier is coupled from the collectors of the input transistors through a cascode stage to collector resistors and the power source. From the voltage outputs of the amplifier, the input of a feedback loop is connected to a pair emitter follower circuits which provide a minimum load, high impedance connection to the output. The outputs of the emitter follower circuits are connected through a unidirectional conductor, such as a diode, to a peak detector which may be a reversed diode acting as a capacitor. The peak detector detects the maximum voltage value in the circuit which is the maximum AC value at the output plus any direct current offset. Because of the capacitance of these elements, the alternating current component is removed leaving as a differential value only the differential direct current offset voltage.

The outputs of the peak detectors are connected to a Darlington high gain, differential amplifier stage which has an active load to increase the current gain and thus function as an operational amplifier. In addition, this Darlington differential amplifier has as a source of emitter current a controlled current source which controls emitter current to a low value to both avoid discharge of the peak detector voltage values and to enhance the low noise operation of the circuit.

The output of the operational amplifier configuration drives a Darlington PNP current amplifier. The collector current output of the PNP current amplifier is connected with the collectors of the primary differential amplifier ahead of the cascode stage. The use of a PNP current source with NPN differential amplifier stage means that the offset current compensation functions by reducing the current through the collector resistors of the differential amplifier since that current is passed through the PNP current amplifier. Thus, instead of enhancing the direct current offset compensation by drawing additional current in the collector circuit of the differential amplifier, the feedback loop functions to reduce the collector current in the collector resistors of the differential amplifier by passing it through the PNP circuit amplifier stage thus, allowing for reduced noise in the circuit.

IN THE DRAWING FIGURE

The single drawing FIGURE is a circuit diagram of an active offset compensation circuit according to one embodiment of the present invention.

DESCRIPTION OF THE PREFERRED EMBODIMENT

Referring now to the FIG., a circuit 10 according to the present invention has a pair of NPN transistors 12 and 14 forming a differential amplifier. The input voltages are supplied as indicated by the legend and base resistors 16 and 18 associated with transistors 12 and 14, respectively, serve their normal function. The emitter current for the differential amplifier pair of transistors 12 and 14 is provided by transistor 20 which has its base voltage controlled by resistor 22 and diodes 24, 26, and 28. The emitter current of transistor 20 is supplied by transistors 30, 32, 34, 36, 38, 40, and 42 all connected in parallel and which operate as a controlled current source with resistors 31, 33, 35, 37, 39, 41, and 43. The base voltage of these transistors is provided by a reference voltage 45 within the circuit. The combination of transistor 20 and transistors 30 through 42 provide a carefully controlled and regulated current to the emitters of transistors 12 and 14.

Transistors 50 and 52 have their emitters coupled to the collectors or transistors 12 and 14, respectively, and serve as a cascode output stage for the differential amplifier transistors. The collectors of transistors 50 and 52 are provided with source current through collector resistors 51 and 53. The output voltages of the differential amplifier are provided at terminations 54 and 56. Connections 55 and 57 are provided to a pair of emitter follower transistor 60 and 62, respectively.

Emitter follower transistor 60 has its emitter current provided by transistor 64, transistor 66 and resistor 68 and, similarly, transistor 62 has its emitter current provided by transistor 70, transistor 72 and resistor 74. The output voltage of emitter follower transistor 60 is coupled through a unidirectional conductor, such as a diode 76, to a reverse diode 78 which serves as a capacitive element and then to the base of transistor 84. Similarly, the emitter output of transistor 62 is coupled through a unidirectional conductor, such as diode 80, to a reversed diode 82 which serves as a capacitance and then to the base of transistor 86.

Transistors 84 and 85 serve as one Darlington pair of a high gain amplifier while transistors 86 and 87 serve as the other Darlington pair of a high gain differential amplifier. The emitter current of the high gain differential Darlington amplifier is provided by transistor 88 which has its base voltage controlled by transistors 80 and 92 together with resistor 94. The emitter of transistor 88 is coupled to the voltage source by resistor 89. The current source formed in combination with transistor 88 serves two functions. First, it maintains the emitter current of transistors 85 and 87 at a comparatively low value to avoid discharge of the voltage value maintained at diodes 78 and 82. Also, the low current value in this emitter circuit serves to maintain the noise value generation within the circuit at as functionally low a value as is possible.

The collector outputs of amplifier transistors 85 and 87 are connected to the collectors of PNP transistors 96 and 98, respectively. Transistors 96 and 98 serve as an active load for amplifier transistors 85 and 87 which causes an increase in the current gain of the circuit. Diodes 100, 102, and 104 in the emitter circuit of transistors 96 and 98 serve as a voltage level shifter. Thus, the Darlington pairs of transistors, 84 and 85 together with 86 and 87 serve as a high gain operational amplifier because of the active load.

The outputs from the collectors of transistors 85 and 86 are also connected with the bases of PNP transistors 110 and 114, respectively. Transistors 110 and 112 form one Darlington pair and transistors 114 and 116 form the other Darlington pair of transistors for the halves of a PNP differential amplifier having a current output. Note that transistors 110, 112, 114 and 116 are PNP transistors while transistors 12 and 14 are NPN transistors. The emitters of transistors 112 and 116 are connected through PNP transistor 118 and resistor 120 to a supply source of current. Thus, the collectors of transistors 112 and 116 serve to supply current, rather than draw current, through connections 122 and 124 to the collectors of transistors 12 and 14, respectively. This serves to draw off collector current from transistors 12 and 14 which would otherwise flow through cascode transistors 50 amnd 52 and finally through collector resistors 51 and 53. By reducing the current through resistors 51 and 53, the thermal noise generation within the circuit is reduced thereby enhancing its usefulness in circuits which must have a low noise function.

The operation of the circuit according to the present invention is as follows. The differential amplifier comprised of transistors 12 and 14 amplifies the input signal which is coupled through a cascode stage of transistors 50 and 52 to outputs 54 and 56. This voltage output is connected through a feedback loop from conductors 55 and 57 to an emitter follower stage which is a high impedance input stage so that it is isolated from the output of the differential amplifier. A peak detector circuit consisting of diodes 76, 78, 80 and 82 serves as a memory for the highest voltage sampled at the differential amplifier output. This in effect preserves the direct current offset bias that may exist at that output.

This offset voltage is amplified using a Darlington differential amplifier having an active load and therefore a very high gain so that the feedback loop is a high gain feedback loop and the output is coupled to a PNP current gain operational amplifier. The high gain operational amplifier has a controlled current source providing emitter current to both reduce noise in the circuit and to reduce any current gain from the peak detector capacitive diodes. The PNP differential current amplifier serves to take some of the collector current generated by transistors 12 and 14 thereby reducing the collector current which flows in resistors 51 and 53 and does so in a fashion as result of the feedback to reduce any direct current differential offset towards a zero value.

The present invention has a significant advantage for use with integrated circuit differential amplifiers. Such amplifiers are cumbersome when they must be individually adjusted as manufactured to various tolerances. The present invention will automatically provide for low differential direct current offset voltage without further adjustment. In addition, some known prior art might provide specifically adjusted compensation for use with a single differential amplifier input stage but, the present invention has advantage where multiple input stages may be connected to the same differential amplifier output.

One advantage of integrated circuit differential amplifiers is that all of the components are processed on the same silicon wafer at the same time and thus the components are well matched as to significant characteristics. However, the matching is not perfect even with the most careful design and the best matching that can be achieved between two transistors according to the present state of the art is about two to three millivolts of equivalent input voltage. Thus, a differential amplifier might have some direct current offset voltage. In an amplifier with a voltage gain of 100, the output offset voltage could be 200 to 300 millivolts. Some differential output can be tolerated but if a voltage gain of 250 or greater is required the output offset voltage becomes excessive. The present invention serves to reduce differential direct current offset in very high gain differential amplifiers to an acceptable level. In addition, by providing a feedback loop which subtracts collector current from the differential transistors so that it does not flow through the collector resistors, the noise performance of the circuit is not degraded as compared to known prior art systems which attempt to produce direct current compensation through means which add to the collector current of the transistor output stage. This circuit is particularly advantageous because it continuously and automatically adjusts for changes in compliment values due to aging as well as when it is connected to switchable input sources.

What is claimed is:

1. An active differential output direct current offset voltage compensation circuit for a differential amplifier comprising:
   a differential amplifier having a pair of inputs for receiving an input voltage source and at least a pair of transistors with the collector voltage representing the outputs,
   a pair of cascode stage amplifiers, one cascode stage connected in the collector output of each transistor of said differential amplifier, the collector outputs of said cascode stages being connected through collector resistors to a supply source and the output of the differential amplifier being the voltage on the collectors of the cascode transistors,
   a pair of transistor emitter follower isolation stage amplifiers, the base of each of the emitter follower transistors connected to the collector outputs of one of said cascode stages,
   a pair of peak detector stages, one of said peak detector stages connected to each of said emitter follower isolation stage amplifiers for removing the alternating current component of the signal output from the emitter follower transistor stage and for holding the value of any direct current offset voltage,
   a pair of high gain operational amplifiers, one of said amplifiers being connected to each of said peak detectors and having a high input impedance,
   a differential current gain amplifier having its inputs connected respectively to the outputs of said operational amplifier and having the current outputs thereof connected with the collector outputs of said differential amplifier so that the current flowing in the output of the current gain amplifier flows through the collectors of said differential amplifier and reduces the current flowing in the cascode stages and the collector resistors of said differential amplifier.

2. A direct current offset voltage compensation circuit for a differential amplifier comprising:
   a differential amplifier haing a pair of inputs for receiving an input source, said differential amplifier having at least first and second transistors, the output at the collectors of said transistors being representative of the output of the circuit,
   first and second load resistor means for carrying current which is to pass through the collectors of said first and second transistors, the voltage drop across said resistors being representative of an output voltage signal,
   first and second isolation means for receiving a signal and connected to receive a signal representative of the output of the circuit from said first and second transistors, respectively, said first and second isolation means having outputs representative of the input,
   first and second peak detector means connected to receive the output from said first and second isolation means for holding a peak signal value,
   first and second high gain amplifier means connected to said first and second peak detector means, respectively, for amplifying said peak detector signal,
   first and second current source amplifier means for receiving output signals from said first and second high gain amplifier means, respectively, said first and second current source amplifier means being connected to the collectors of said first and second transistors so as to reduce curent flowing in said first and second load resistors in order to reduce any direct current offset voltage.

3. The circuit of claim 2 and further comprising a controlled current source for supplying regulated current to the emitters of said first and second transistors.

4. The circuit of claim 2 and further comprising first and second cascode stages connected between said first and second load resistor means and said the collectors of said first and second transistors repectively, wherein said first and second isolation means are connectrd to the resistor side of said cascode stages and wherein said first and second current source amplifier means are connected to the collector side of said cascode stages.

5. The circuit of claim 2 and further comprising an active load means connected to the output of said first and second high gain amplifier means for increasing the gain of said amplifier.

6. The circuit of claim 2 wherein said first and second high gain amplifier means is comprised of a first Darlington differential amplifier having a regulated current source connected to the emitter junction and further comprising third and fourth transistors connected in the collector circuit of the output of said first Darlington differential amplifier to act as an active load and increase the gain of the said amplifier.

7. The circuit of claim 6 wherein said first and second current source amplifier means is a second Darlington differential amplifier connected to said first Darlington amplifier and having the collector circuits of the outputs of said second Darlington amplifier connected to the collectors of said first and second transistors, respectively.

8. The circuit of claim 7 and further comprising first and second cascode stages connected between said first and second load resistor means and said the collectors of said first and second transistors repectively, wherein said first and second isolation stages are connected to the resistor side of said cascode stages and wherein said first and second current source amplifier means are connected to the collector side of said cascode stages.

* * * * *